US010236858B1

United States Patent
Sorenson et al.

(10) Patent No.: US 10,236,858 B1
(45) Date of Patent: Mar. 19, 2019

(54) DIFFERENTIAL SPLIT-ELECTRODE FEEDTHROUGH CANCELLATION MECHANISM

(71) Applicant: HRL LABORATORIES, LLC, Malibu, CA (US)

(72) Inventors: Logan Sorenson, Agoura Hills, CA (US); Raviv Perahia, Agoura Hills, CA (US); Hung Nguyen, Los Angeles, CA (US); David Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 402 days.

(21) Appl. No.: 14/836,462

(22) Filed: Aug. 26, 2015

(51) Int. Cl.
| H03H 9/02 | (2006.01) |
| H01L 41/047 | (2006.01) |
| H01L 41/113 | (2006.01) |
| H03H 9/17 | (2006.01) |
| H03H 9/25 | (2006.01) |
| H03F 3/45 | (2006.01) |

(52) U.S. Cl.
CPC ....... H03H 9/02259 (2013.01); H01L 41/047 (2013.01); H01L 41/1132 (2013.01); H03F 3/45071 (2013.01); H03H 9/02275 (2013.01); H03H 9/17 (2013.01); H03H 9/25 (2013.01); H03F 2203/45116 (2013.01); H03F 2203/45288 (2013.01)

(58) Field of Classification Search
CPC ............. H03H 9/2457; H03H 9/02259; H03H 9/02275; H03H 9/17; H03H 9/25; H03B 5/30; H01L 4/047; H01L 41/1132; H03F 3/45071; H03F 2203/45116

USPC .......................................... 333/186, 187–188
See application file for complete search history.

(56) References Cited

U.S. PATENT DOCUMENTS

| 5,025,346 A |   | 6/1991  | Tang et al. |
| 5,955,932 A | * | 9/1999  | Nguyen ............. G01R 33/0286 331/116 M |
| 6,043,726 A | * | 3/2000  | Solal .................... H03H 9/0028 310/313 D |
| 6,441,704 B1 | * | 8/2002 | Ali-Hackl ............ H03H 9/0038 310/313 B |
| 7,279,761 B2 |   | 10/2007 | Acar et al. |
| 7,808,332 B1 | * | 10/2010 | Pedersen ............ H03H 9/02259 331/154 |
| 2013/0120081 A1 | * | 5/2013 | Zuo .................... H03H 9/02228 333/187 |

OTHER PUBLICATIONS

U.S. Appl. No. 14/024,506, filed Sep. 11, 2013, Kirby et al.
Aydin O., and Akin, T., "A Bulk-Micromachined Fully Differential MEMS Accelerometer With Split Interdigitated Fingers," *IEEE Sensors Journal*, vol. 13, No. 8, pp. 2914-2921, (Aug. 2013).
Blevins, R.D., "Formulas for natural frequency and mode shape," Krieger Publishing Company, pp. 298-299, (2001).

(Continued)

*Primary Examiner* — Robert J Pascal
*Assistant Examiner* — Jorge L Salazar, Jr.
(74) *Attorney, Agent, or Firm* — Ladas & Parry

(57) ABSTRACT

An electromechanical resonator including a drive electrode set having at least one pair of alternating pole interdigitated drive electrodes and including a sense electrode set having at least one pair of alternating pole interdigitated sense electrodes.

19 Claims, 18 Drawing Sheets

(56) References Cited

OTHER PUBLICATIONS

Chan, M. L., Xie, J., Fonda, P., Najar, H., Yamazaki, K., Lin, L., and Horsley, D. A., "Micromachined Polycrystalline Diamond Hemispherical Shell Resonators," *Solid-State Sensors, Actuators, and Microsystems Workshop Hilton Head Island*, South Carolina, pp. 355-358, (Jun. 3-7, 2012).

Chiu, S.-R., Sue, Sue, C.-Y., Liao, L.-P., Teng, L.-T., Hsu, Y.-W., and Su, Y.-K., "A Fully Integrated Circuit for MEMS Vibrating Gyroscope Using Standard 0.25um CMOS Process," *International Microsystems, Packaging, Assembly and Circuits Technology Conference (IMPACT)*, 2011 6th International, pp. 315-318, (2011).

Senkal, D., Raum, C.R., Trusov, A.A., and Shkel, A.M., "Titania Silicate/Fused Quartz Glassblowing for 3-D Fabrication of Low Internal Wineglass Micro-Structures," *Solid-State Sensors, Actuators, and Microsystems Workshop Hilton Head Island*, South Carolina, pp. 267-270, (Jun. 3-7, 2012).

Shao, P., Mayberry, C. L., Gao, X., Tavassoli, V., and Ayazi, F., "JMEMS Letters a Polysilicon Microhemispherical Resonating Gyroscope," *Journal of Microelectromechanical Systems*, vol. 23, No. 4, pp. 762-764, (Aug. 2014).

Shao, P., Sorenson, L.D., Gao, X., and Ayazi, F., "Wineglass-On-A-Chip," *Solid-State Sensors, Actuators, and Microsystems Workshop Hilton Head Island*, South Carolina, pp. 275-278, (Jun. 3-7, 2012).

\* cited by examiner

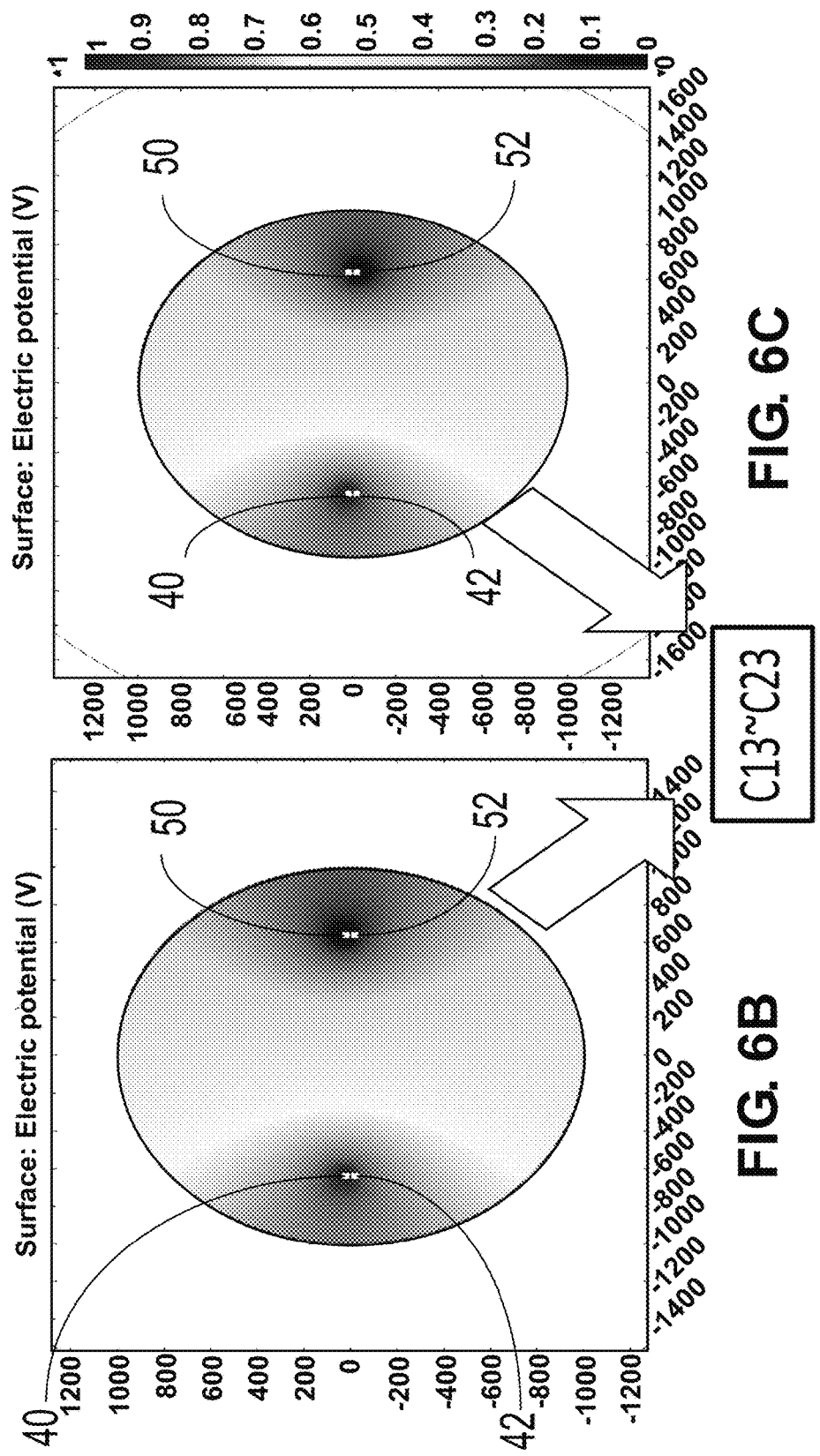

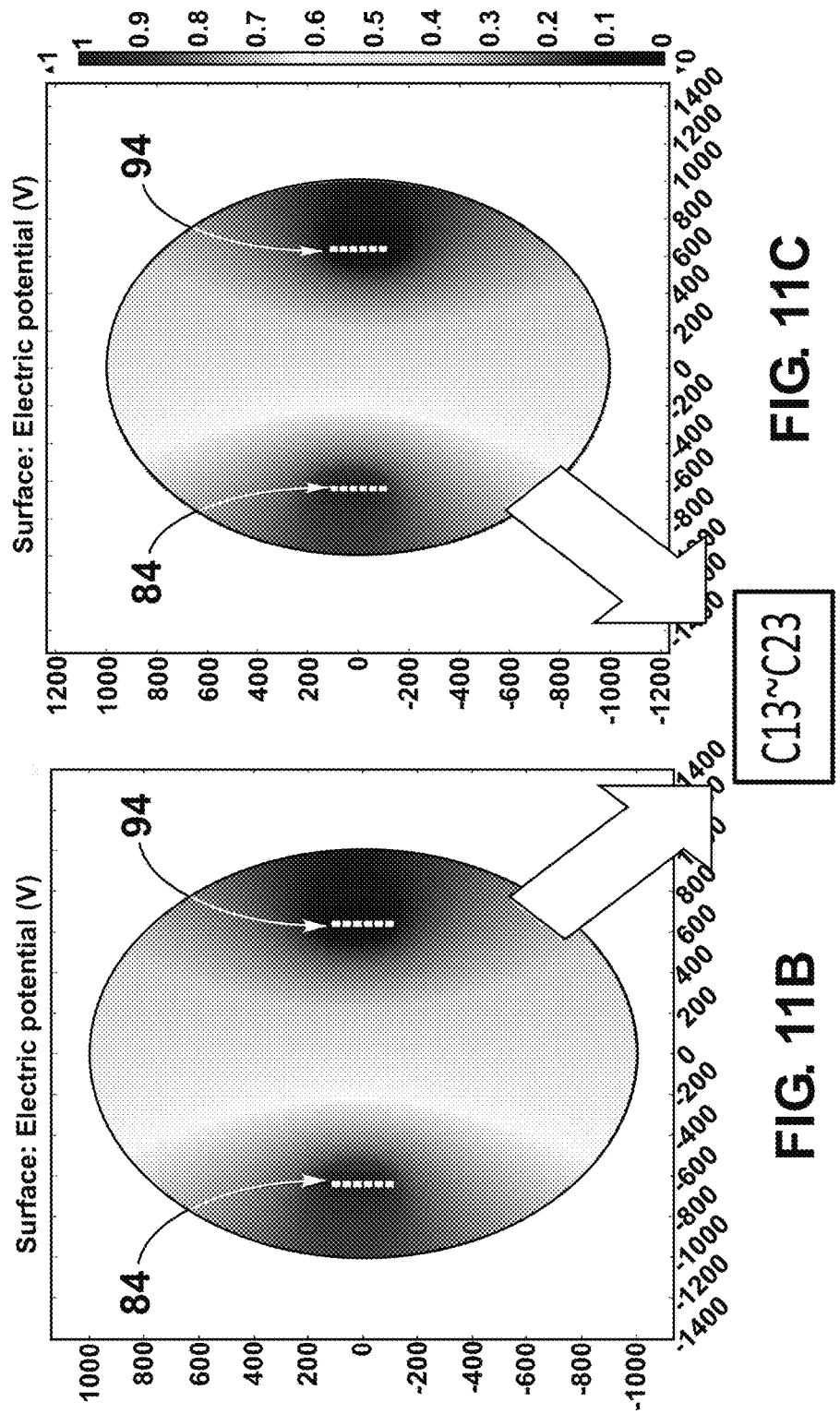

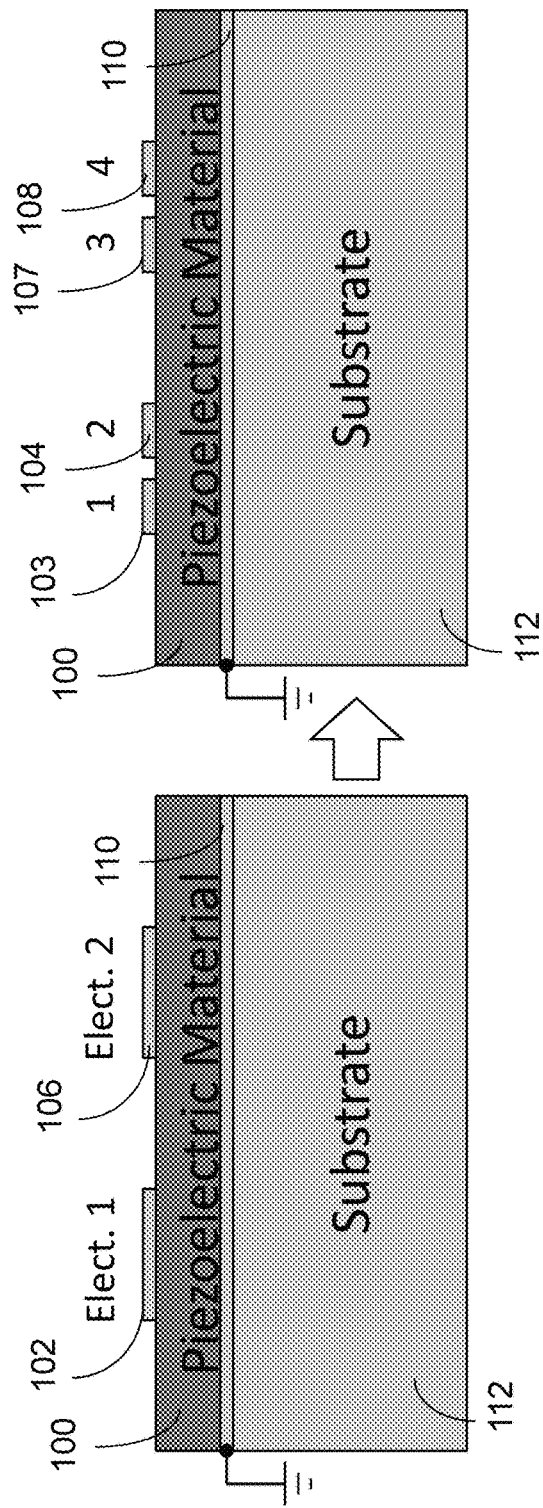

DIFFERENTIAL SPLIT-ELECTRODE FEEDTHROUGH CANCELLATION MECHANISM

CROSS REFERENCE TO RELATED APPLICATIONS

This application is related to U.S. patent application Ser. No. 15/083,190, filed Mar. 28, 2016, and to U.S. patent application Ser. No. 14/024,506, filed Sep. 11, 2013, which are incorporated herein by reference as though set forth in full.

STATEMENT REGARDING FEDERAL FUNDING

None

TECHNICAL FIELD

This disclosure relates to mechanisms for actuating and detecting mechanical motion, and in particular to micro and nanoscale mechanisms.

BACKGROUND

It is desirable to enable continuous drive and readout of the motion of an electromechanical device without the deleterious signal corrupting effects of parasitic feedthrough capacitance. Prior art electrostatic transducers employ parallel plate or comb drive electrostatic actuators which suffer from parasitic feedthrough capacitance. To mitigate feedthrough in prior art electrostatic transducers, methods are used such as modulating to a higher frequency, filtering the capacitive feedthrough out, and then demodulating back to baseband. Another method is to generate a cancellation current by inverting the drive signal and passing it through an external capacitor balanced with the parasitic feedthrough capacitance. Both of these methods require additional circuitry which may complicate the design of a micro-electro-mechanical system (MEMS) and are sensitive to environmental perturbations such as temperature induced shifts of the parasitic feedthrough capacitance.

The following references are incorporated by reference.

C. Acar and A. M. Shkel, "Post-release capacitance enhancement in micromachined devices and a method of performing the same," U.S. Pat. No. 7,279,761 B2, 9 Oct. 2007 describe a prior art interdigitated comb drive structure which does not exhibit differential drive or feedthrough reduction.

O. Aydin and T. Akin, "A Bulk-Micromachined Fully Differential MEMS Accelerometer With Split Interdigitated Fingers," IEEE Sensors Journal, vol. 13, no. 8, pp. 2914-2921, August 2013 describe prior art split interdigitated parallel plate structures which exploit differential changes in capacitance caused by a moving proof mass; however, they demonstrate no reduction in feedthrough.

S.-R. Chiu, C.-Y. Sue, L.-P. Liao, L.-T. Teng, Y.-W. Hsu, and Y.-K. Su, "A fully integrated circuit for MEMS vibrating gyroscope using standard 0.25 um CMOS process," in Microsystems, Packaging, Assembly and Circuits Technology Conference (IMPACT), 2011 6th International, 2011, pp. 315-318 describe a differential MEMS gyroscope architecture, however feedthrough is not reduced by splitting of electrodes.

P. Shao, C. L. Mayberry, X. Gao, V. Tavassoli, and F. Ayazi, "JMEMS Letters A Polysilicon Microhemispherical Resonating Gyroscope," Journal of Microelectromechanical Systems, vol. Early Access Online, 2014 describe feedthrough cancellation by inverting the drive signal with an op amp and passing through a capacitor to cancel feedthrough parasitic capacitance.

W. C. Tang and R. T. Howe, "Laterally driven resonant microstructures," U.S. Pat. No. 5,025,346 A, 18 Jun. 1991 describe a prior art MEMS resonator of the type shown in FIG. 1, described below, which has capacitive feedthrough.

What is needed is a mechanism and method for actuating and detecting mechanical motion that greatly reduces or ideally cancels parasitic feedthrough signals which otherwise corrupt the measurements of prior art microelectromechanical (MEMS) devices. The embodiments of the present disclosure answer these and other needs.

SUMMARY

In a first embodiment disclosed herein, an electromechanical resonator comprises a drive electrode set comprising at least one pair of alternating pole interdigitated drive electrodes, and a sense electrode set comprising at least one pair of alternating pole interdigitated sense electrodes.

In another embodiment disclosed herein, a piezoelectric-on-substrate MEMS resonator comprises a piezoelectric layer, a drive electrode set comprising at least one pair of alternating pole interdigitated drive electrodes on the piezoelectric layer, and a sense electrode set comprising at least one pair of alternating pole interdigitated sense electrodes on the piezoelectric layer and separated from the drive electrode set by a gap.

In still another embodiment disclosed herein, a phononic crystal acoustic processing device comprises a piezoelectric interdigitated drive transducer, a phononic crystal coupled to the piezoelectric interdigitated drive transducer, and a piezoelectric interdigitated sense transducer coupled to the phononic crystal on a side of the phononic crystal opposite to the piezoelectric interdigitated drive transducer, wherein the piezoelectric interdigitated drive transducer comprises a piezoelectric layer, and at least one pair of alternating pole interdigitated drive electrodes on the piezoelectric layer, and wherein the piezoelectric interdigitated sense transducer comprises at least one pair of alternating pole interdigitated sense electrodes on the piezoelectric layer.

In still another embodiment disclosed herein, a device for providing alternating pole interdigitated drive electrodes and alternating pole interdigitated sense electrodes comprises a first drive pad, a second drive pad, a first sense pad, a second sense pad, a first drive bus coupled to the first drive pad, a second drive bus coupled to the second drive pad, a first sense bus coupled to the first sense pad, a second sense bus coupled to the second sense pad, a plurality of first drive electrode fingers coupled to the first drive bus, a plurality of second drive electrode fingers coupled to the second drive bus, a plurality of first sense electrode fingers coupled to the first sense bus, a plurality of second sense electrode fingers coupled to the second sense bus, wherein the plurality of first drive electrode fingers are interdigitated with the plurality of second drive electrode fingers so that the first drive electrode fingers and the second drive electrode fingers alternate, and wherein the plurality of first sense electrode fingers are interdigitated with the plurality of second sense electrode fingers so that the first sense electrode fingers and the second sense electrode fingers alternate.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 5A is a graph of results when one feedthrough capacitance branch is opened, FIG. 5B is a graph of results when another feedthrough capacitance branch is opened, and FIG. 5C is a graph of results when two feedthrough capacitance branches are opened, and FIGS. 5A, 5B and 5C show that capacitive feedthrough that is not cancelled results in a corrupted Vod/Vid transfer function in accordance with the present disclosure;

FIGS. 6A, 6B and 6C show finite element models and computation of electric potential for the 4 electrical node configuration of parasitic capacitances shown in FIG. 3 in accordance with the present disclosure;

FIGS. 11A, 11B and 11C show electric potential computations using a finite element method to determine the parasitic capacitances between the 4 effective lumped electrical nodes of the interdigitated alternating pole electrode configuration of FIG. 10 with 6 electrodes per electrode set in accordance with the present disclosure;

FIG. 13A shows a piezoelectric-on-substrate MEMS resonator in accordance with the prior art and FIG. 13B shows a differential drive and sense mechanism to cancel parasitic feedthrough capacitance in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes an improved mechanism for actuating and detecting mechanical motion at the micro and nanoscale using electrostatic or piezoelectric transduction. A split electrode configuration for gradient force drive and sense of a micromechanical structure is described. The mechanism of the present disclosure has a near ideal cancellation of parasitic feedthrough signals which otherwise corrupt the measurements of prior art micro-electro-mechanical (MEMS) devices.

In the present disclosure an electrode which ordinarily would be an electrically conductive continuous structure with a single electrical node having equal electric potential across the face of the electrode, is split into one or more interdigitated pairs of fingers which are combined together into two electrical nodes in an alternating fashion. This is done for two electrodes, one of which is responsible for inducing mechanical vibration in the mechanical structure and hence termed the "drive" electrode and another "sense" electrode which is responsible for measuring the amount of vibration induced by the drive electrode. By splitting both the drive and sense electrodes into sets of two or more electrical nodes each while keeping the two electrical nodes in a single electrode set in close proximity, a device can be created which almost perfectly balances the parasitic capacitances between the electrical nodes of the drive electrode set and the electrical nodes of the sense electrode set.

The prior art describes other approaches to deal with feedthrough; however, these prior art methods require additional circuitry which may complicate the design of the MEMS system and are sensitive to environmental perturbations such as temperature induced shifts of the parasitic feedthrough capacitance. In contrast, the mechanisms of the present disclosure avoid these issues by imposing a symmetry on the MEMS structure such that it is nearly in ideal balance at all times, resulting in almost perfect feedthrough cancellation.

Figure 1:
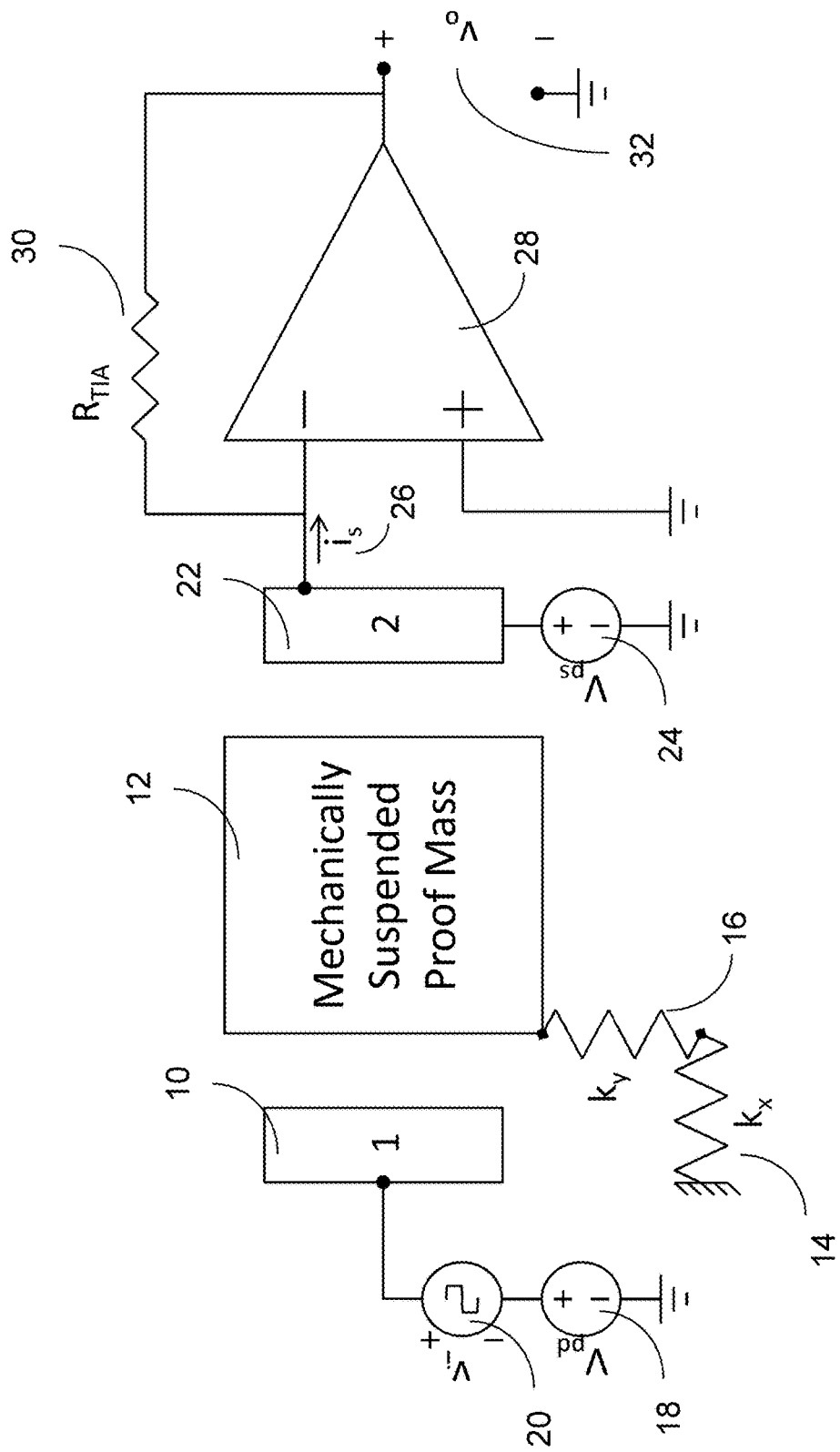
FIG. 1 shows a schematic of a electrostatic MEMS resonator in accordance with the prior art.

FIG. 1 shows a schematic of a prior art electrostatically driven and sensed MEMS resonator using parallel plate capacitive transducers. In FIG. 1, the mechanically fixed drive electrode 10 is labeled as electrical node 1. The gap between the drive electrode 10 and the effective mechanically suspended proof mass 12 forms the first parallel plate capacitive transducer. The proof mass 12 is shown in FIG. 1 as suspended by a pair of effective mechanical springs Kx 14 and Ky 16. Ky 16 may be assumed in some cases to be infinite such that the vibrational motion of the mass 12 occurs only in a single degree-of-freedom (DOF) along the horizontal or X direction. The effective spring and effective mass 12 may represent a discrete/lumped element system, or it may represent a distributed stiffness and mass system, such as for an acoustic wave device. The proof mass 12 is assumed to be electrically conductive and at an electric ground potential of 0 volts. Applying a DC voltage Vpd 18 across the drive capacitive gap between the drive electrode 10 and the proof mass 12 energizes the gap and enables transduction of a small AC voltage Vi 20 into a sinusoidal mechanical motion or vibration at the driving frequency of Vi 20. A sense electrode 22 is located on another side of the proof mass 12. The sense electrode 22 is labeled as electrical node 2 and acts as a "pick-off" to sense the mechanical motion in the proof mass 12 induced by the drive electrode 10. The location of the sense electrode 22 in FIG. 1 is shown as physically located directly across from the drive electrode; however, the location of the sense electrode 22 depends on the device design. A DC voltage Vps 24 on the sense electrode 22 energizes the sense gap and enables conversion of the mechanical motion of the proof mass 12 into an AC time-varying current $i_s$ 26 proportional to the velocity, vibration, or varying displacement of the proof mass 12. This sensed current $i_s$ 26 is fed through a transimpedance amplifier (TIA) 28 which uses a feedback resistor (R_TIA) 30 to convert the motional current signal 26 into an output voltage signal Vo 32 proportional to the motion of the mechanical proof mass 12.

If the open loop transfer function abs(Vd/Vi) of the resonator is examined over the frequency domain by sweeping the frequency of the drive signal Vi, there will be a sharp peak at the resonance frequency of the proof mass 12 if the mechanical quality factor (Q) is sufficiently high. However, depending on the specific design of the device, a situation often arises when the resonance peak is buried in the feedthrough capacitance which is due to parasitic coupling between the drive 10 and the sense 22 nodes. Hence, electrical feedthrough can make driving and sensing the mechanical resonance of the device very difficult or impossible. Further, this feedthrough can prevent closing of the loop in an oscillator configuration, preventing the desired oscillation at the mechanical resonance frequency from occurring. Hence, it is desirable to mitigate or eliminate the parasitic feedthrough capacitance. It is important to note that in the prior art, the drive and sense electrodes comprise a single electrical node each, but they are typically long along one dimension, such as along the Y axis as shown in FIG. 1, to increase the area and coupling efficiency of the capacitive parallel plate transducers.

Figure 2:
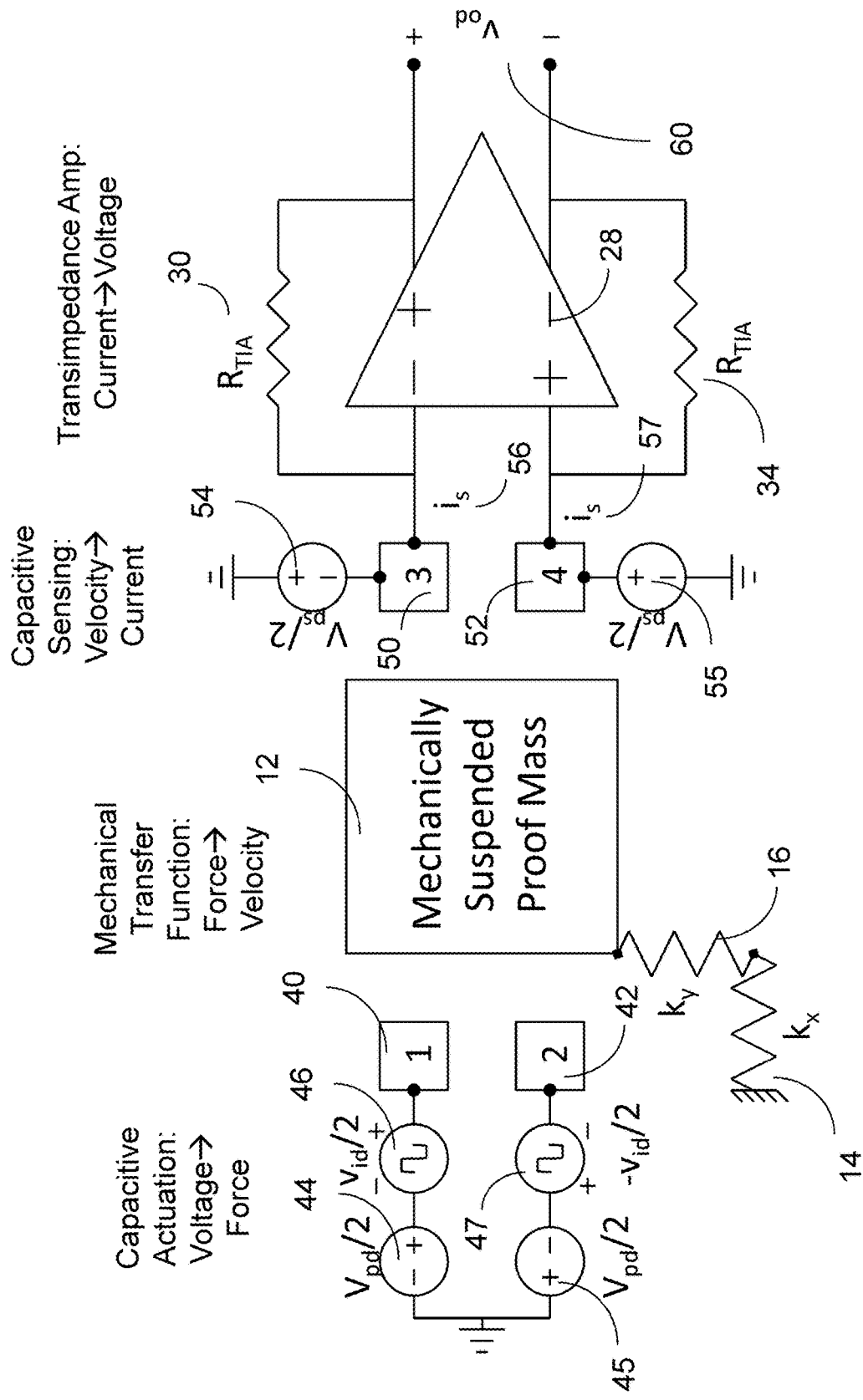
FIG. 2 shows a schematic of a differential gradient force drive and sense mechanism in accordance with the present disclosure.

FIG. 2 shows a schematic of a differential gradient force drive and sense mechanism in accordance with the present disclosure. In this configuration, the drive electrode has been split into a first drive electrode 40 and a second drive electrode 42, and the sense electrode has been split into a first sense electrode 50 and a second sense electrode 52. The first drive electrode 40 has a DC voltage of +Vpd/2 44, and the second drive electrode 42 has a DC voltage of −Vpd/2 45, so that the total potential difference between drive electrode 40 and drive electrode 42 is Vpd. The first sense electrode 50 has a DC voltage of −Vps/2 54, and the second sense electrode 52 has a DC voltage of +Vps/2 45, so that the total potential difference between sense electrode 50 and sense electrode 52 is Vps. Drive electrode 40 and drive electrode 42 may be spaced as close to each other as possible or located far apart from each other depending on the design of the device. Similarly, sense electrode 50 and sense electrode 52 may also be spaced as close to each other as possible or located far apart from each other depending on the design of the device. The input driving voltage is split into out of phase halves such that the AC voltage Vid/2 46 applied to drive electrode 42 is positive while the AC voltage −Vid/2 47 applied to node 2 is negative. This combination of out of phase electrical voltages is termed differential drive.

On the sense side, the motional currents $i_s$ 56 and 57 from sense electrodes 50 and 52, respectively, are out of phase for a uniform motion of proof mass 12. This is an example of differential sense. The sense electrode 50 is connected to the negative input of differential TIA 28 and the sense electrode 52 is connected to the positive input of differential TIA 28. The differential TIA 28 has a feedback resistor (R_TIA) 30 to the negative input of TIA 28 and a feedback resistor (R_TIA) 34 to the positive input of TIA 28. The TIA 28 amplifies the differential motional currents 56 and 57 and converts them to a differential output voltage Vod 60. A person skilled in the art will understand that the device also operates if the first sense electrode 50 has a DC voltage of +Vps/2, and the second sense electrode 52 has a DC voltage of −Vps/2. The total potential difference between sense electrode 50 and sense electrode 52 is still Vps.

The transfer function of the device of FIG. 2 is Vod/Vid, and has a resonance peak in abs(Vod/Vid) at the mechanical resonance frequency of the proof device 12, as in the device of FIG. 1. However, in the configuration of FIG. 2, the parasitic capacitances between drive electrode 40 and sense electrode 50, and between drive electrode 42 and sense electrode 50 are approximately equal. Therefore, because the drive electrodes 40 and 42 are driven by Vid/2 46 and −Vid/2 47, which are 180 degrees out of phase, the feedthrough currents generated by these parasitic capacitances are out of phase and cancel each other out at sense electrode 50. The parasitic feedthrough capacitances between drive electrode 40 and sense electrode 52 and between drive electrode 42 and sense electrode 52 are also approximately equal so the feedthrough currents generated by these parasitic capacitances are out of phase and also cancel each other out at sense electrode 52. The proof mass 12 may be either a conductor or a dielectric material. In the case of a conductor, the proof mass is ideally connect to ground potential, but a nonzero potential may be chosen in certain cases. The proof mass may also be a cylindrical shell, a fused quartz disk, a dielectric material or a doped semiconducting material. Such a cylindrical shell is further described in U.S. patent application Ser. No. 14/024,506, filed Sep. 11, 2013, which is incorporated herein by reference.

Figure 3:
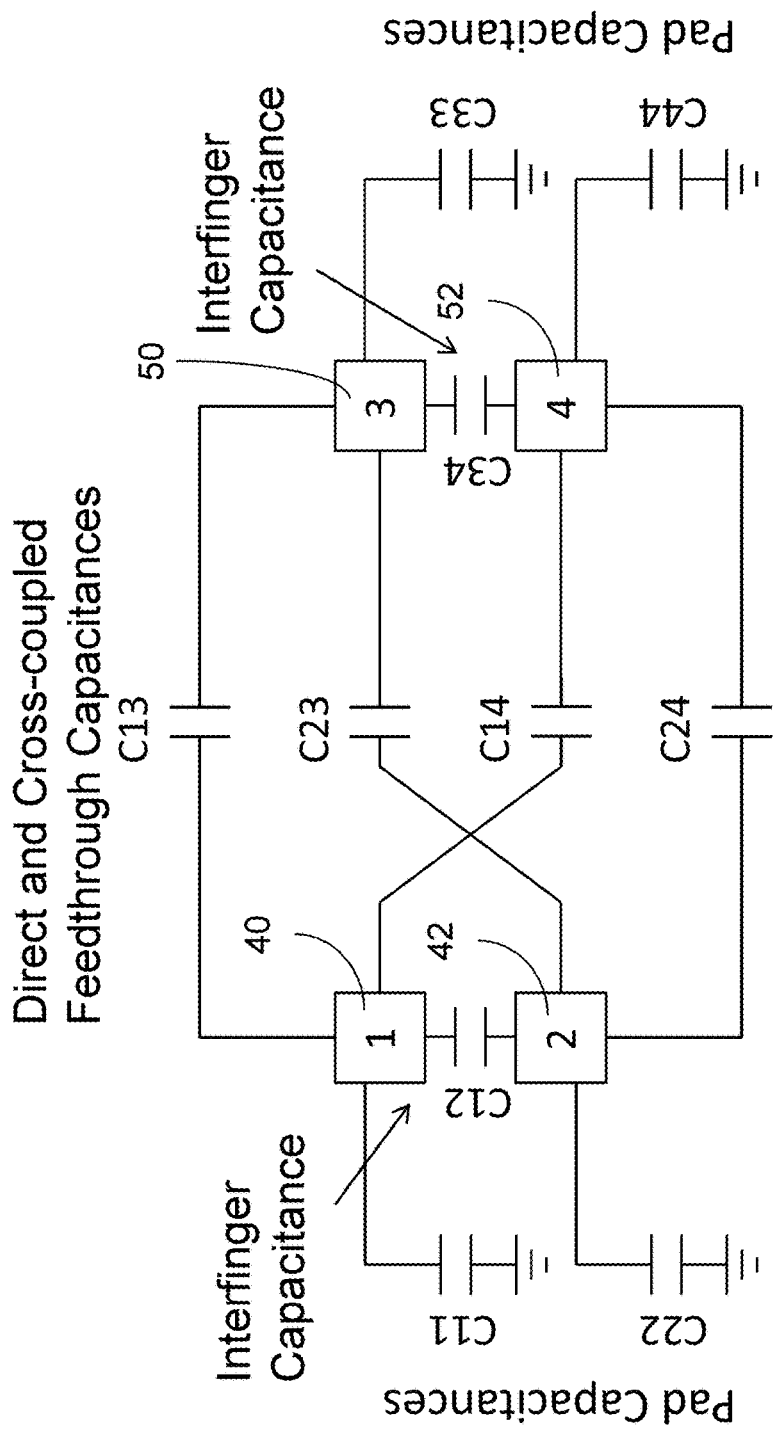
FIG. 3 shows electrical nodes of the drive electrode set (1,2) of FIG. 2 and the sense electrode set (3, 4) of FIG. 2 and the parasitic capacitances between them including the pad capacitances to electrical ground in accordance with the present disclosure.

FIG. 3 shows the parasitic capacitances which exist between drive electrodes 40 and 42 and sense electrodes 50 and 52. There are three classes of parasitic capacitances: pad capacitances which exist between a drive or sense electrode and ground, interfinger capacitances which exist between one drive electrode and another drive electrode within an electrode set, such as drive electrodes 40 and 42, or between one sense electrode and another sense electrode within an electrode set, such as sense electrodes 50 and 52. So, for example, C12 represents the interfinger capacitance between drive electrodes 40 and 42. The feedthrough capacitances are direct and cross-coupled between each drive and sense electrode. For a device with 4 total drive and sense electrodes, these capacitances come in ideally balanced pairs: (C13, C23) form one balanced pair and (C14, C24) form another balanced pair. These balanced pairs are exploited in the present disclosure to cancel out feedthrough capacitance by the differential drive and sense configuration shown in FIG. 2.

Figure 4:
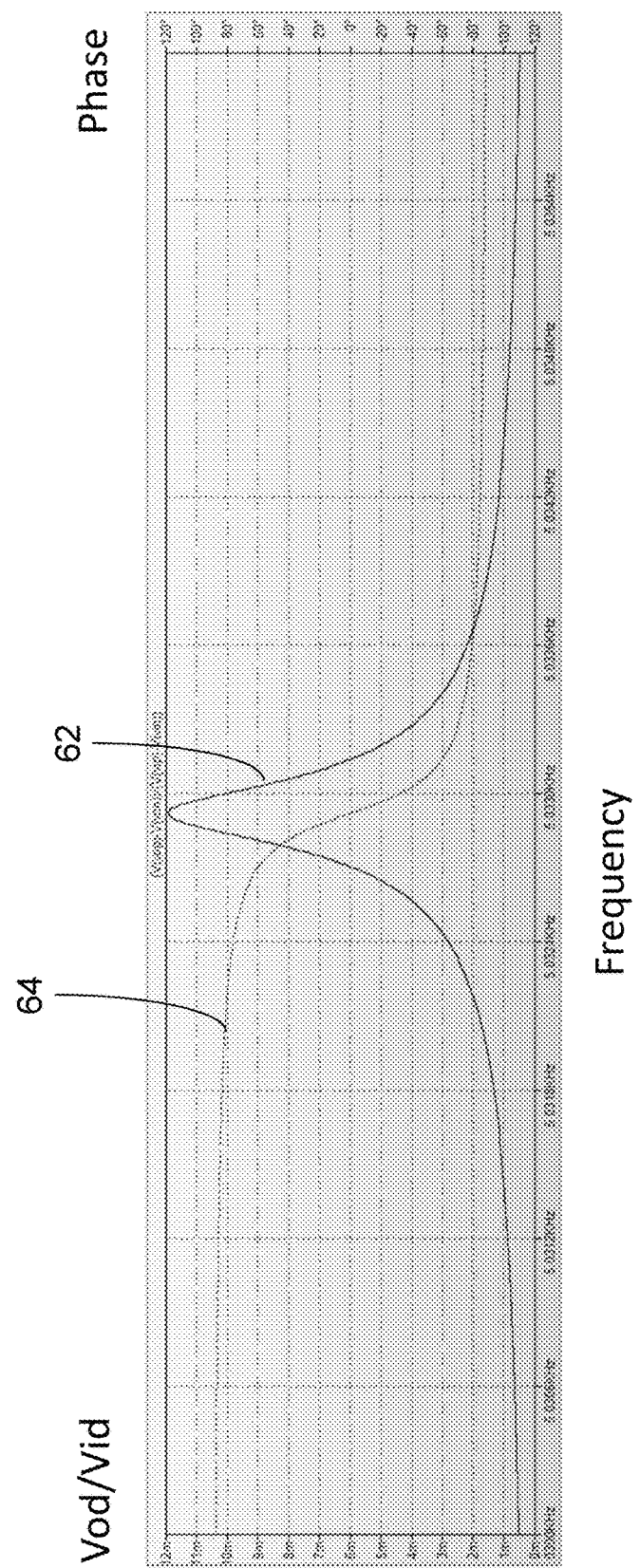
FIG. 4 shows a graph of SPICE simulation of a Vod/Vid transfer function for a MEMS resonator model with split differential drive and sense electrodes in accordance with the present disclosure.

A SPICE simulation has been implemented for the resonator of FIG. 2. FIG. 4 is a graph of the result of running the SPICE simulation. The bottom axis is frequency, the left axis is Vod/Vid, and the right axis is phase. The curve 62 shows the response of abs(Vod/Vid), and the curve 64 shown the phase of Vod/Vid. A clean resonance peak is observed at the mechanical resonance frequency of 5 kHz and shows no additional deleterious feedthrough signals. This is because the feedthrough parasitic capacitances exist in balanced pairs and because of the split drive electrodes 40 and 42 are driven differentially and the split sense electrodes 50 and 52 are sensed differentially.

Figure 5A:
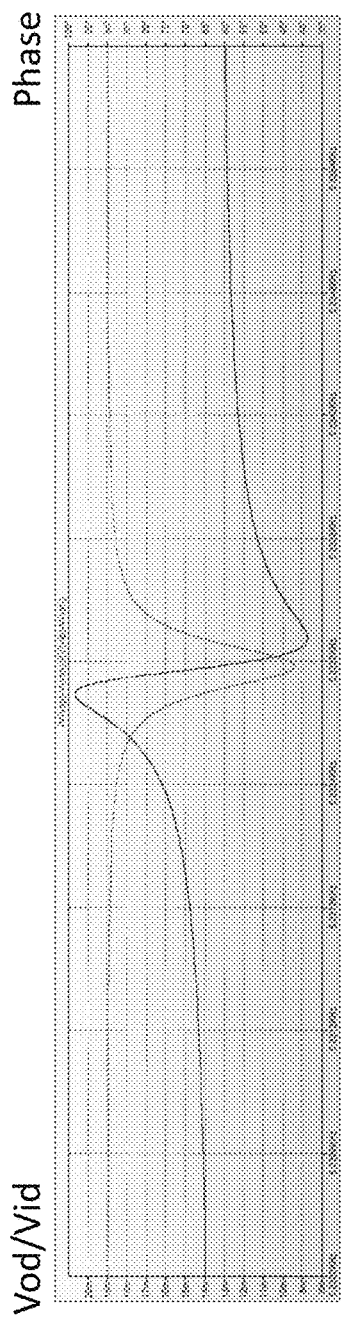
FIGS. 5A, 5B and 5C show graphs of SPICE simulations.

FIG. 5A shows the result of cutting out one feedthrough capacitance branch, such as feedthrough capacitor C13 shown in FIG. 3. The result is that the parasitic capacitances are imbalanced and nonzero feedthrough results as seen in the magnitude and phase plots of the transfer function shown in FIG. 5A. About 13 mV/V of feedthrough signal is observed for this imbalanced case. Hence, this example shows that the balanced configuration cancels feedthrough signals, while the imbalanced configuration does not cancel the feedthrough signal.

Figure 5B:
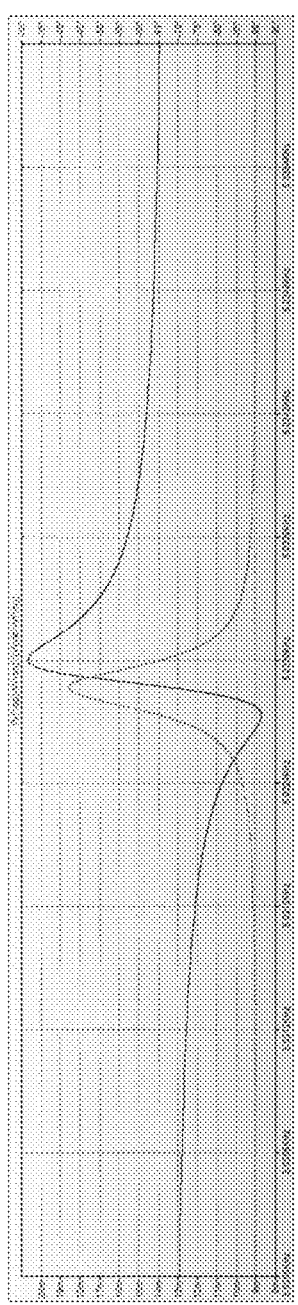

FIG. 5B shows the result of cutting the other feedthrough capacitance branch C23 shown in FIG. 3. The feedthrough is again imperfectly balanced, but its phase is shifted opposite to the previous case, flipping the resonance peak and antiresonance valley positions. Feedthrough is again about 13 mV/V in magnitude.

Figure 5C:
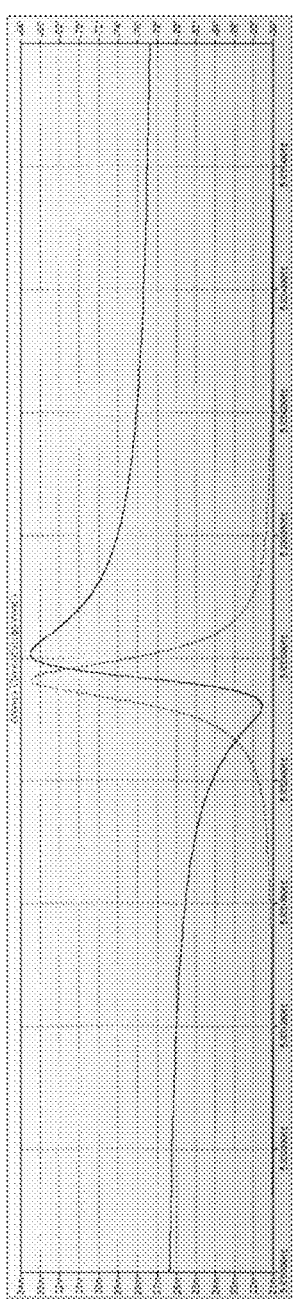

FIG. 5C shows a case of cutting two feedthrough parasitic capacitance branches are cut such that the feedthrough signal is maximized. The feedthrough doubles to 26 mV/V. This is equal to what the feedthrough would be for an equivalent prior art single-ended configuration as shown in FIG. 1 if the feedthrough capacitance was twice C13.

Figure 6A:
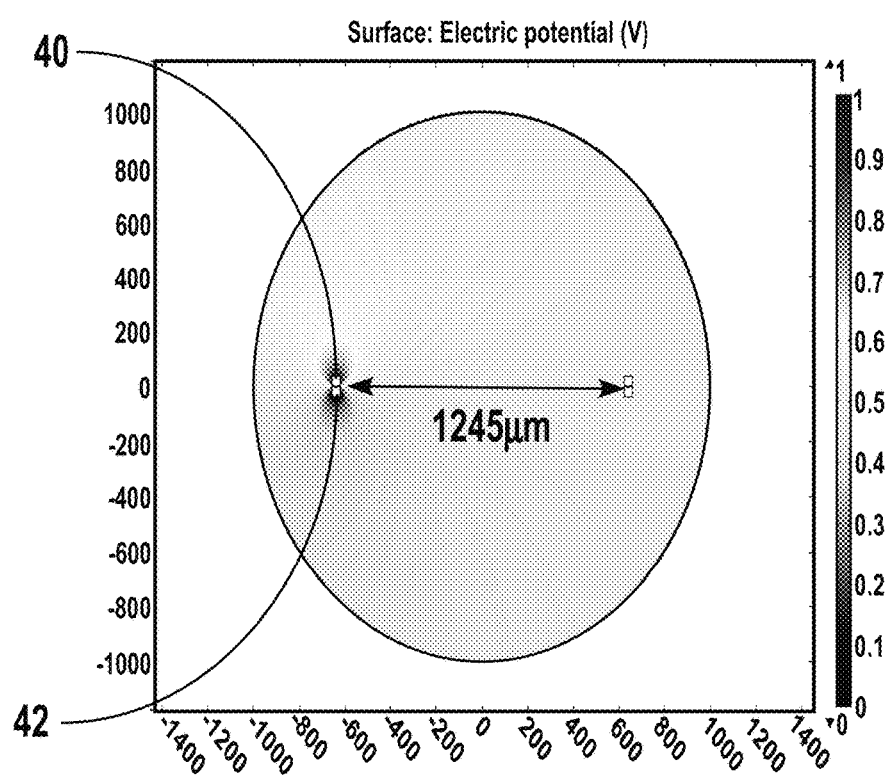

FIGS. 6A, 6B and 6C show finite element modeling of the electric potential field to calculate the interfinger C12 and and feedthrough capacitances C13 and C23, as shown in FIG. 3. In the particular case shown, the drive electrode set on the left corresponding to drive electrodes 40 and 42, which consists of two 35 μm square electrodes separated by a 4 μm gap in the vertical direction. The sense electrode set on the right corresponding to sense electrodes 50 and 52, which consists of two 35 μm square electrodes separated by a 4 μm gap in the vertical direction. The drive electrode set and the sense electrode set are separated by 1245 μm in the horizontal direction. In FIG. 6A, a 1 V test signal is applied to the drive electrode 40 and a 0 V ground is applied to the drive electrode 42 to measure C12, which is the capacitance between drive electrode 40 and 42. C12 was measured to be 104.2 pF, and by symmetry this is also the capacitance C34 between sense electrode 50 and 52.

In FIG. 6B a 1 V test signal is applied to the drive electrode 40 and a 0 V ground is applied to the sense electrode 50 to measure C13, which is the capacitance between drive electrode 40 and sense electrode 50. In FIG. 6C a 1 V test signal is applied to the drive electrode 42 and a 0 V ground is applied to the sense electrode 50 to measure C23, which is the capacitance between drive electrode 42 and sense electrode 50. C13 was measured to be 5.2877 pF and C23 was measured to be 5.2854 pF. Therefore, the feedthrough capacitance imbalance ΔC=C13-C23 was found to be 2.3 fF over an average value of 5.2866 pF, which is a relative difference of only 435 ppm, which is a very small degree of mismatch. By symmetry C24 is expected to equal C13, and C14 is expected to equal C23.

Figure 7:
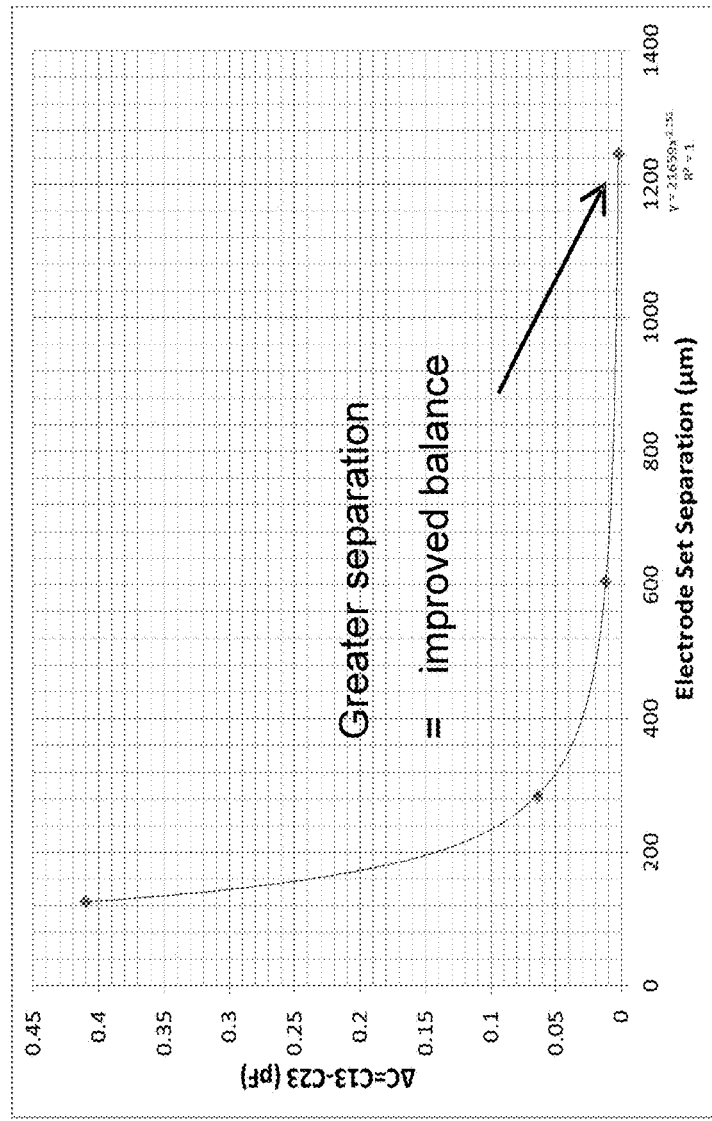
FIG. 7 shows differential capacitance imbalance between parasitic feedthrough capacitance pairs as a function of electrode set separation.
Figure 8:
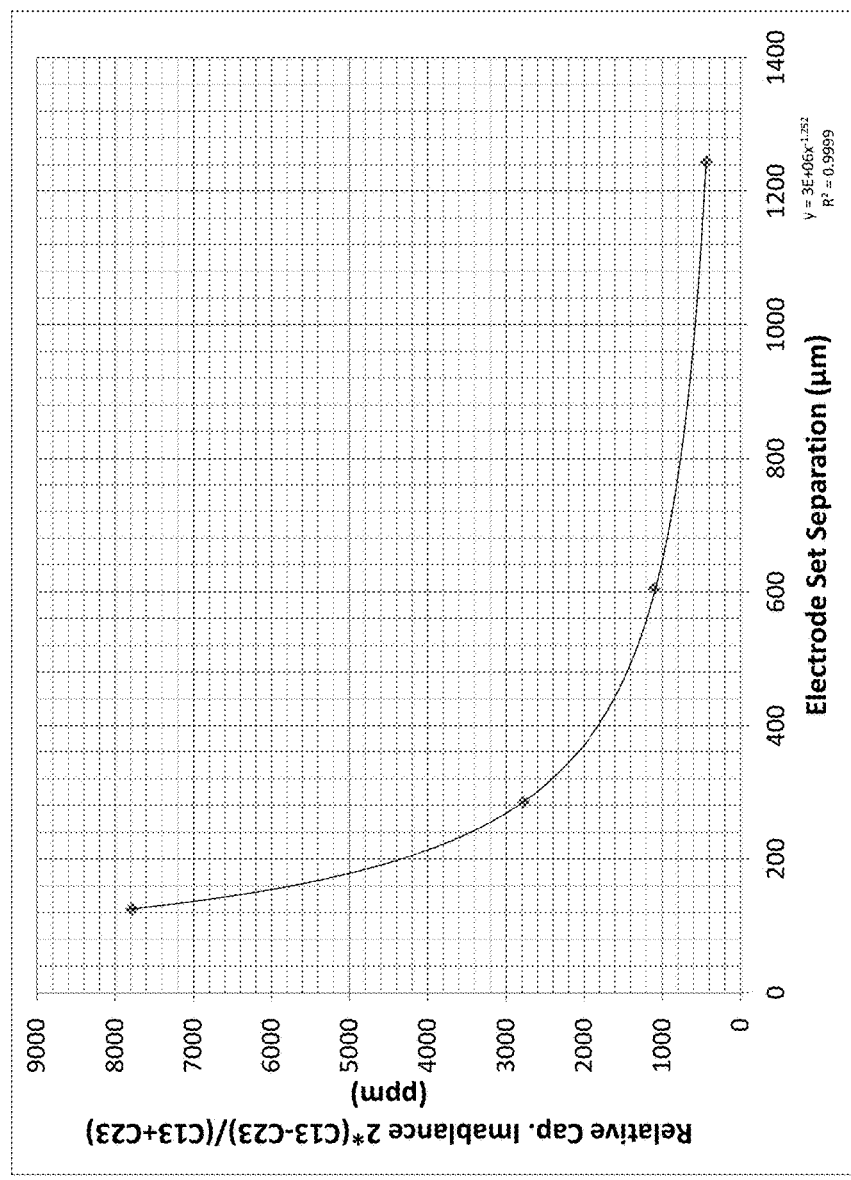
FIG. 8 shows relative capacitance imbalance in ppm as a function of electrode set separation, and the graphs show that in both absolute and relative terms, a larger separation is preferred between the electrode sets for the best parasitic feedthrough capacitance balancing in accordance with the present disclosure.

FIGS. 7 and 8 show the effect of varying the horizontal separation between electrode sets. As the electrode set separation is increased, the differential capacitance imbalance decreases, indicating that the parasitic feedthrough capacitance pairs become more balanced as the electrode sets are moved apart. In other words, the electrode sets look like a point source which contains two electrical poles internally.

FIG. 7 shows the differential capacitance imbalance between parasitic feedthrough capacitance pairs as a function of electrode set separation. FIG. 8 shows the relative capacitance imbalance in ppm as a function of electrode set separation. In both absolute and relative terms, a larger separation is preferred between the electrode sets for the best parasitic feedthrough capacitance balancing, resulting in the least amount of capacitive feedthrough possible.

Figure 9:
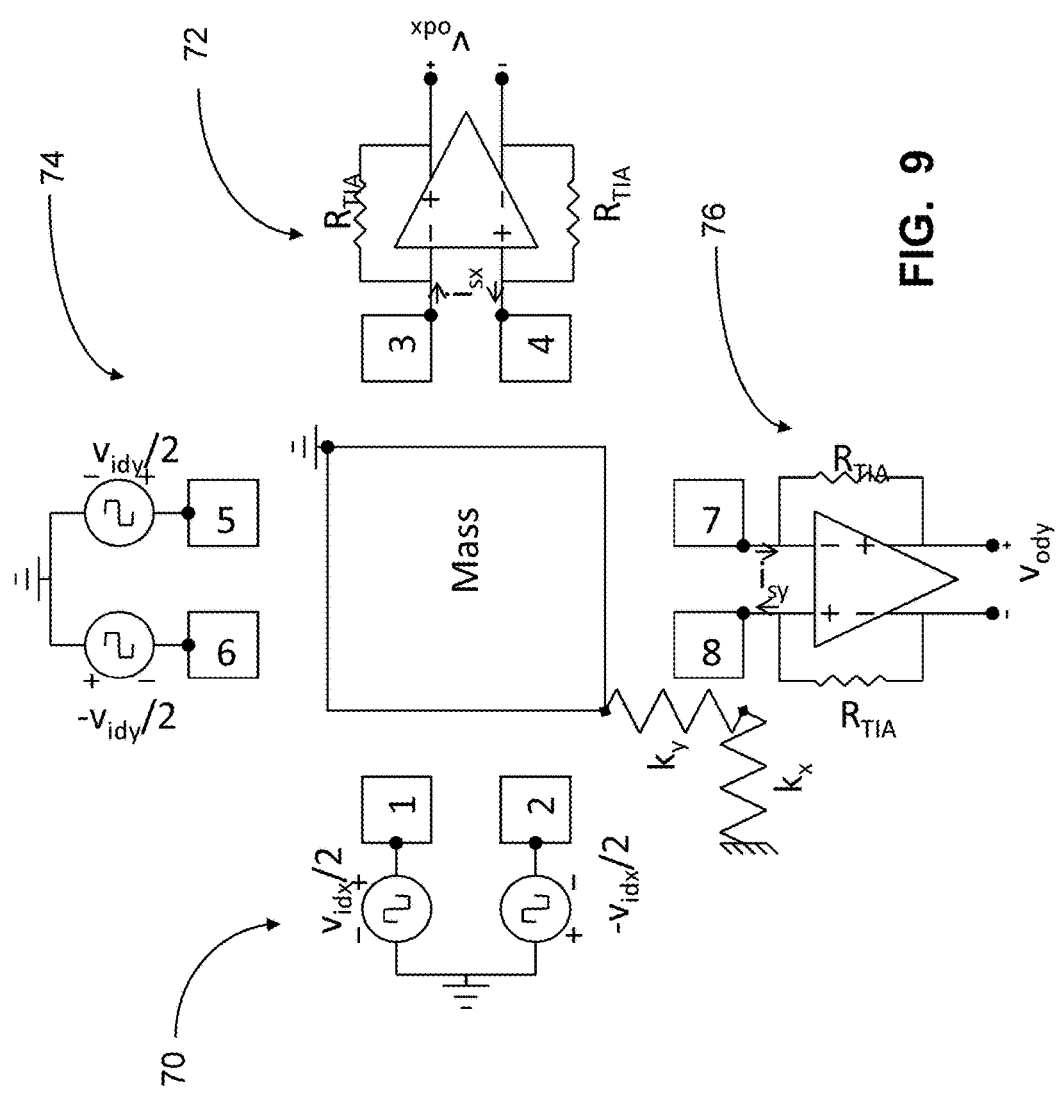
FIG. 9 shows a schematic representation of a two degree-of-freedom (DOF) MEMS gyroscope employing differential gradient force drive and sense mechanisms in accordance with the present disclosure.

FIG. 9 shows schematically an application of the differential gradient free drive and sense mechanism to a generic 2 degree-of-freedom MEMS gyroscope. Conceptually, this is similar to FIG. 2; however, in addition to the vibration mode in X, which is driven by differential driver 70 and sensed by differential sensor 72, an additional vibration mode in Y is included in the model along with a corresponding differential driver 74 and differential sensor 76. The gyroscope works by coupling energy between vibration mode X and vibration mode Y due to Coriolis forces generated when the device is rotated. The amount of energy is proportional to the rotation rate, and by monitoring the outputs of both the X and Y modes, this energy can be determined unambiguously, leading to a determination of the rotation rate of the MEMS gyroscope device.

Figure 10:
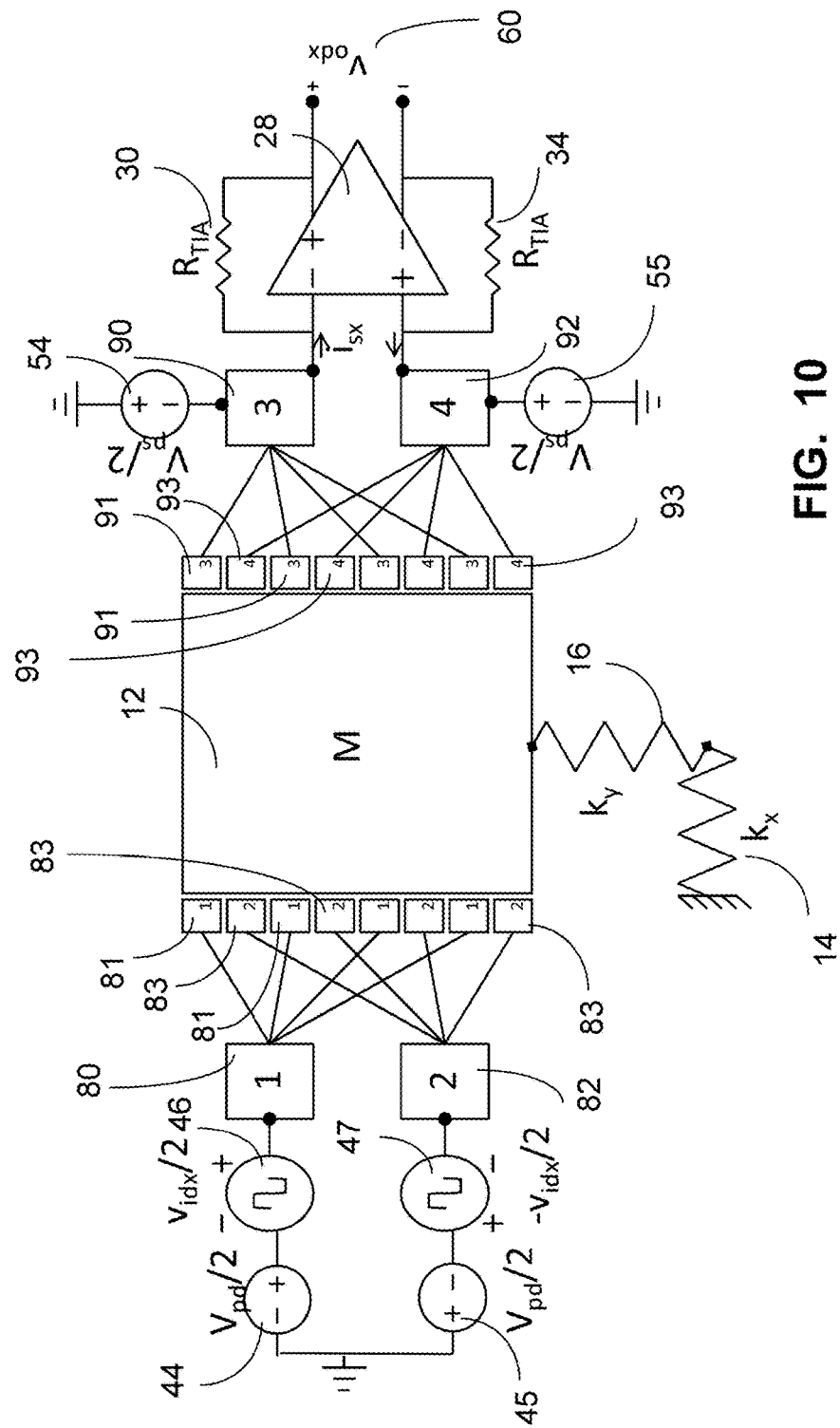
FIG. 10 shows a MEMS resonator with alternating pole interdigitated differential gradient force drive and sense mechanisms illustrating that the physical arrangement of the electrodes can be split into multiple alternating pole interdigitated electrode pairs in accordance with the present disclosure.

FIG. 10 shows a 1 degree of freedom (DOF) MEMS resonator where the drive electrodes 40 and 42 of FIG. 2 have been split out into a linear arrangement of multiple pairs of electrodes of alternating electrical polarity, which may be called an interdigitated alternating pole electrode configuration. The same interdigitated alternating pole electrode configuration is implemented on the sense side to replace the sensor electrodes 50 and 52 of FIG. 2.

As shown in FIG. 10, the output 80 of Vid/2 46 is connected to electrodes 81 and the output 82 of –Vid/2 47 is connected to electrodes 83. The drive electrodes 81 and 83 alternate so that the electrodes are arranged as drive electrodes 81, 83, 81, 83, 81, 83, 81 and so on. The drive electrodes have alternating electrical polarity and are interdigitated. Also, as shown in FIG. 10, the input 90 to the negative input of TIA 28 is connected to sense electrodes 91 and the input 92 to the positive input of TIA 28 is connected to sense electrodes 93. The sense electrodes 91 and 93 alternate so that the electrodes are arranged as 91, 93, 91, 93, 91, 93, 91 and so on. The sense electrodes have alternating electrical polarity and are interdigitated.

Figure 11A:
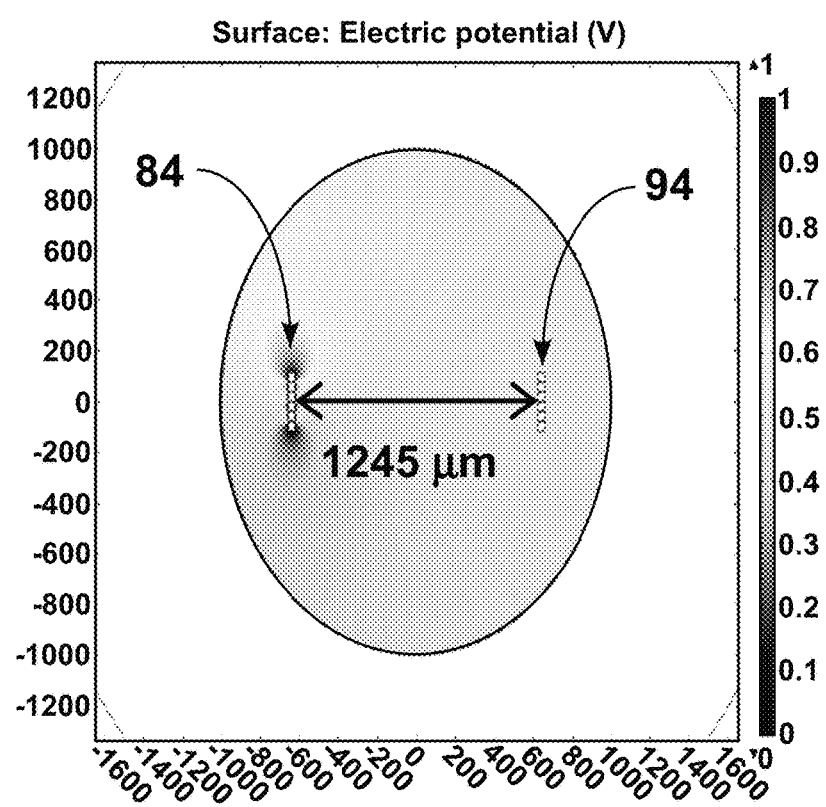

FIGS. 11A, 11B and 11C show the computed electric potential for the interdigitated alternating pole electrode configuration of FIG. 10. Since the alternating pole configuration for a 1 DOF MEMS resonator is electrically equivalent to a lumped 4 electrical node configuration, and because of symmetry only 3 computations of parasitic capacitance are required as before. In this case, six 35 μm square electrodes 81, 83, 81, 83, 81 and 83, which are shown in FIGS. 11A, 11B and 11C as driver electrode set 84, separated in the vertical direction by 4 μm. The sense electrode set is again separated from the drive electrode set by 1245

μm. On the sense electrode side, a similar physical arrangement of the sense electrodes is used, but the sense electrode sequence is 91, 93, 91, 93, 91 and 93, which are shown in FIGS. 11A, 11B and 11C as sensor electrode set 94.

The interfinger parasitic capacitance was measured to be 488.8 pF, and despite the effective electrode area increasing by approximately 3 times (6/2), the parasitic feedthrough capacitance between drive electrodes 81 and sense electrodes 91 only increased from 5.2877 pF to 6.9477 pF, an increase of only about 1.3. The parasitic feedthrough capacitance between drive electrodes 83 and sense electrodes 91 was measured to be 6.9442 pF. So the differential parasitic capacitance imbalance was 3.5 fF in this case, or 500 ppm, which corresponds favorably to the relative capacitance imbalance obtained for FIGS. 6B and 6C of 435 ppm, showing that an alternating pole configuration is also effective in reducing parasitic capacitive feedthrough while increasing the effective capacitive area which is used to apply force and sense the velocity of the vibration.

Figure 12A:
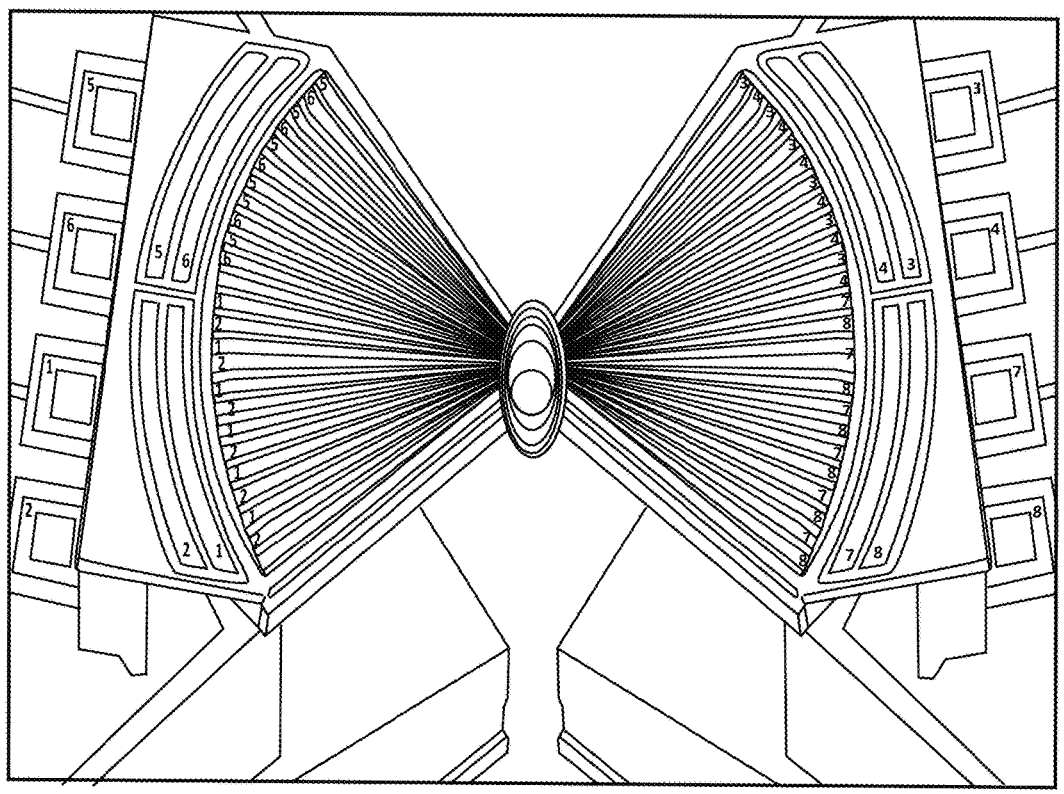
FIG. 12A shows a photograph of a physically realized implementation of an interdigitated alternating pole differential gradient force drive and sense mechanism for a 2 degree of freedom (DOF) MEMS gyroscope.
Figure 12B:
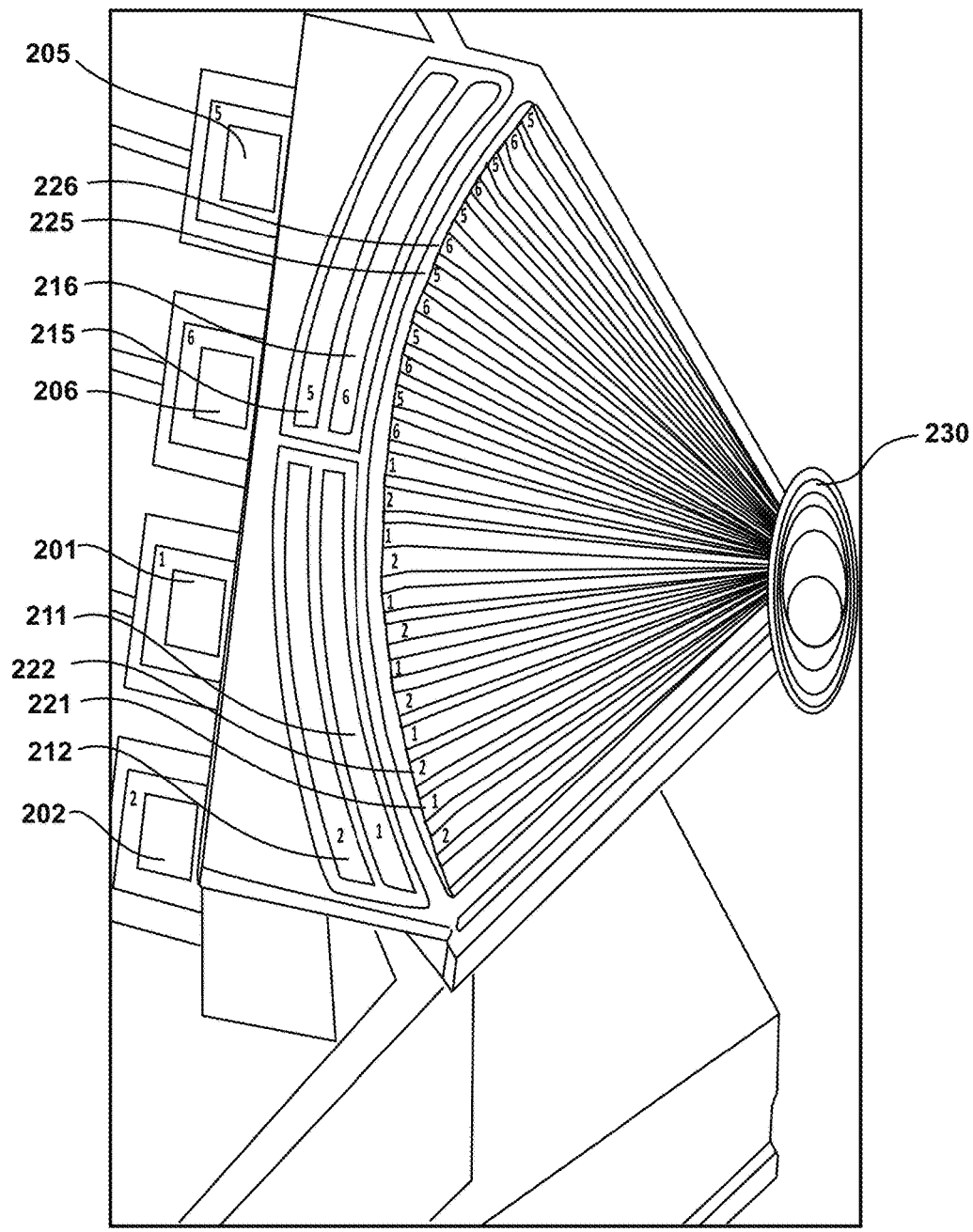
FIG. 12B shows an enlarged portion of FIG. 12A in accordance with the present disclosure.

FIG. 12A shows a photograph of a physically realized implementation of a device with interdigitated alternating pole differential gradient force drive electrodes and sense electrodes for a 2 DOF MEMS gyroscope. FIG. 12B shows an enlarged portion of the drive portion of FIG. 12A. As shown in FIG. 12B, the device has pads 201, 202, 205 and 206, which are connected to bus bars 211, 212, 215 and 216, respectively. The bus bars 211, 212, 215 and 216 are in turn connected to multiple interdigitated electrode fingers 221, 222, 225, and 226, respectively. The electrode fingers 221 are interdigitated with electrode fingers 222 to provide alternating pole interdigitated drive electrodes in one dimension, and electrode fingers 225 are interdigitated with electrode fingers 226 to provide alternating pole interdigitated drive electrodes in a second dimension to the vibrating structure 230, which is shown in FIG. 12B as an oxide cylindrical shell; however, the vibrating structure 230 may be another MEMS resonator structure. The alternating pole interdigitated sense electrodes are implemented in a similar manner as shown in FIG. 12A. For the application of a cylindrical shell the interdigitated fingers are arranged to be extend to be near the circumference of the cylindrical shell.

FIG. 13A shows a prior art piezoelectric-on-substrate MEMS resonator structure that has a piezoelectric layer 100, a bottom electrode layer 110, and a possible substrate layer 112. The bottom electrode layer may be optionally connected to electrical ground. Two electrodes 102 and 106 are on the piezoelectric layer 100. Electrode 102 of the prior art resonator can be considered the drive electrode, while electrode 106 can be considered the sense electrode. The vibration pattern might be a longitudinal acoustic mode in either the thickness or lateral directions.

FIG. 13B shows an alternate embodiment of the present disclosure applied to a piezoelectric MEMS device that shows the physical structure of the piezoelectric MEMS resonator modified to employ a differential drive via drive electrodes 103 and 104 and a differential sense via sense electrodes 107 and 108 to cancel the feedthrough of the device.

Figures 14A, 14B:
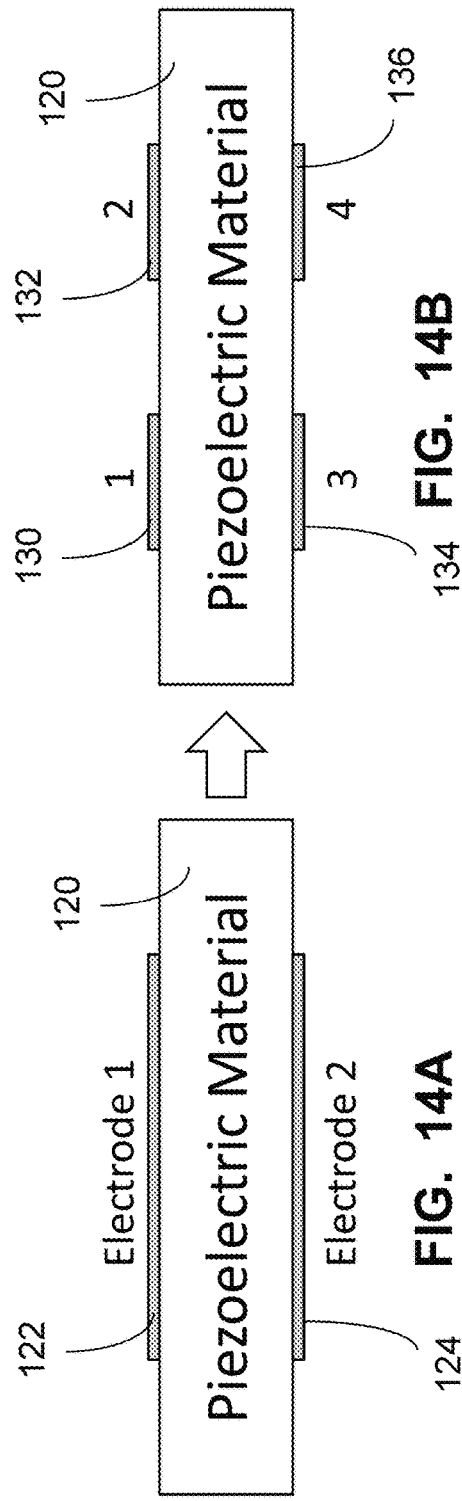
FIG. 14A shows a piezoelectric MEMS resonator in which the piezoelectric material might be quartz in accordance with the prior art.
FIG. 14B shows a differential drive and sense mechanism applied to a piezoelectric MEMS resonator to cancel parasitic feedthrough capacitance in accordance with the present disclosure.

FIGS. 14A and 14B shows a second alternate embodiment of the invention applied to a piezoelectric MEMS device. FIG. 14A shows a prior art resonator comprising a a piezoelectric layer 120, a top drive electrode 122 and a bottom sense electrode 124. The piezoelectric material may be Quartz. The vibration pattern of the resonator might be a thickness shear mode of the device. In applying the differential drive and sense mechanism to cancel feedthrough in this device, the electrodes are modified to form an electrode set for the drive from electrodes 130 and 132 and also an electrode set for the sense from electrodes 134 and 136, as shown in FIG. 14B.

Figure 15:
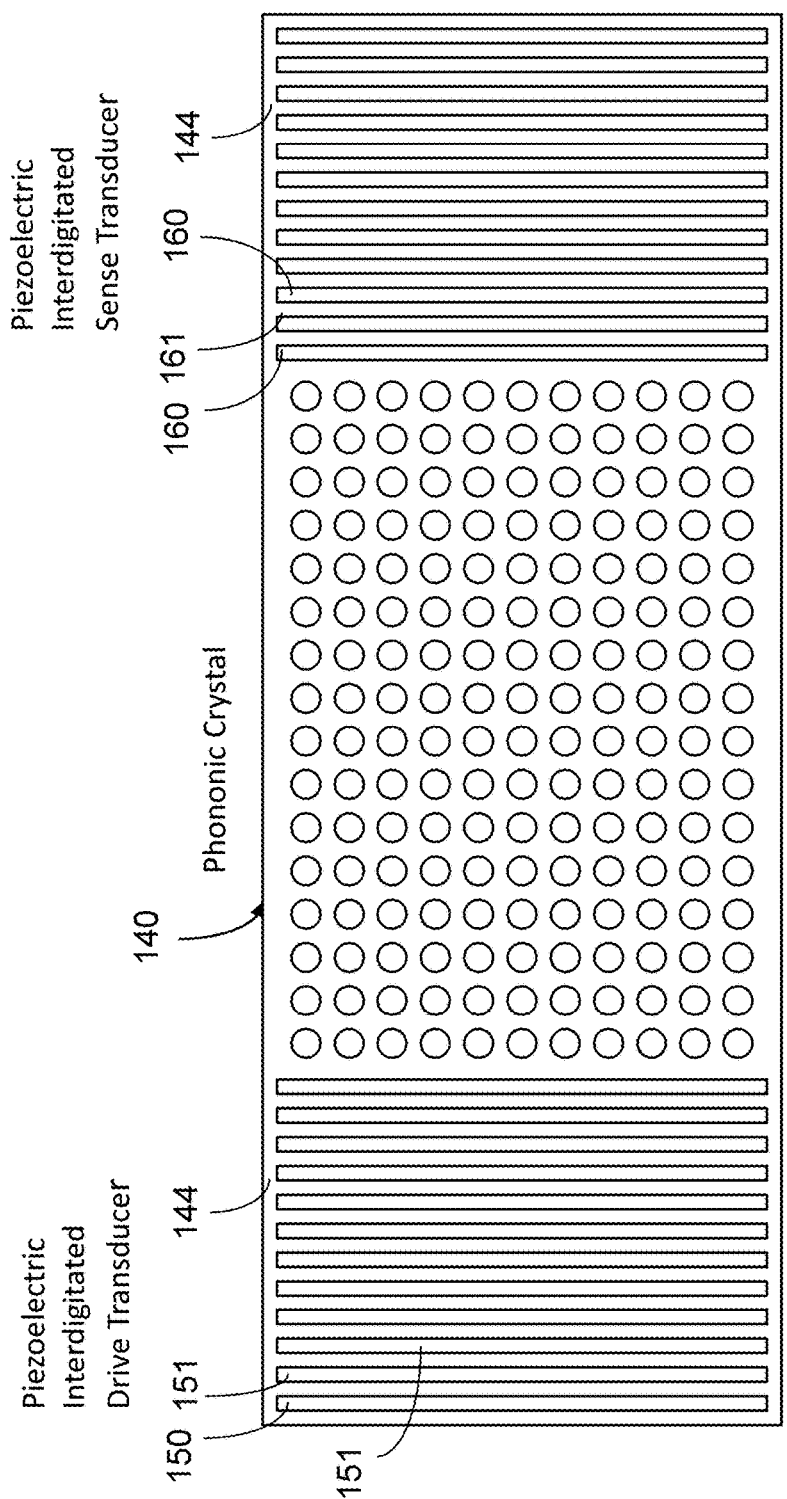
FIG. 15 shows a phononic crystal acoustic signal processing device comprising piezoelectric interdigitated alternating pole differential drive and sense transducers coupled by a phononic crystal region which performs acoustic signal processing, in which the differential drive and sense mechanism enables improved acoustic signal processing by cancelling parasitic capacitive feedthrough signals in accordance with the present disclosure.

FIG. 15 shows an embodiment of the present disclosure in which interdigitated drive transducers 150, 151, 150, 151 and so on, integrated on a piezoelectric layer 144 launch acoustic waves, either bulk or surface, across a phononic crystal 140 on the device. The phononic crystal 140 may perform a signal processing operation on the acoustic signal, such as filtering out undesired frequencies, encoding temperature, or encoding presence of an analyte, among other possible operations. The result is then detected by interdigitated sensor transducers 160, 161, 160, 161, 160, and so on, on the piezoelectric layer 144 on the other side of the phononic crystal 140. By using interdigitated drive and sense transducers, a long-felt problem with these types of devices in which the parasitic capacitive feedthrough signal overwhelms the desired acoustic signal can be overcome, enabling construction of improved acoustic signal processing and sensing devices.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:
1. An electromechanical resonator comprising:
   a drive electrode set comprising at least one pair of alternating pole interdigitated drive electrodes;
   a sense electrode set comprising at least one pair of alternating pole interdigitated sense electrodes;

a resonator between the drive electrode set and the sense electrode set;
a first gap between the drive electrode set and the resonator; and
a second gap between the sense electrode set and the resonator;
wherein the resonator comprises a dielectric material, a cylindrical shell, a fused quartz disk, or a doped semiconducting material.

2. The electromechanical resonator of claim 1:
wherein the at least one pair of alternating pole interdigitated drive electrodes comprises a first drive electrode having a first polarity and a second drive electrode having a second polarity 180 degrees out of phase with the first polarity; and
wherein the at least one pair of alternating pole interdigitated sense electrodes comprises a first sense electrode having a third polarity and a second sense electrode having a fourth polarity 180 degrees out of phase with the third polarity.

3. The electromechanical resonator of claim 2:
wherein the first drive electrode is coupled to a first alternating current (AC) driving voltage source;
wherein the second drive electrode is coupled to a second AC driving voltage source; and
wherein the second AC driving voltage source is 180 degrees out of phase with the first AC driving voltage source.

4. The electromechanical resonator of claim 3:
wherein the first AC driving voltage source is Vid/2; and
wherein the second AC driving voltage source is −Vid/2.

5. The electromechanical resonator of claim 4 further comprising:
a first direct current (DC) voltage source having a DC voltage divided by two is coupled to the first alternating current (AC) driving voltage source;
a second DC voltage source having the negative of the DC voltage divided by two is coupled to the second alternating current (AC) driving voltage source;
a third DC voltage source having a third voltage divided by two; and
a fourth DC voltage source having the negative of the third voltage divided by two;
wherein the third DC voltage source is coupled to the first sense electrode; and
wherein the fourth DC voltage source is coupled to the second sense electrode.

6. The electromechanical resonator of claim 2 further comprising:
a first parasitic feedthrough capacitance between the first drive electrode and the first sense electrode;
a second parasitic feedthrough capacitance between the second drive electrode and the first sense electrode;
a third parasitic feedthrough capacitance between the first drive electrode and the second sense electrode; and
a fourth parasitic feedthrough capacitance between the second drive electrode and the second sense electrode;
wherein feedthrough due to the first and second parasitic capacitance from the first and second drive electrodes to the first sense electrode is reduced due to the first and second drive electrodes being driven 180 degrees out of phase with one another; and
wherein feedthrough due to the third and fourth parasitic capacitance from the first and second drive electrodes to the second sense electrode is reduced due to the first and second drive electrodes being driven 180 degrees out of phase with one another.

7. The electromechanical resonator of claim 1:
wherein each pair of alternating pole interdigitated drive electrodes comprises a first drive electrode having a first polarity and a second drive electrode having a second polarity 180 degrees out of phase with the first polarity; and
wherein each pair of alternating pole interdigitated sense electrodes comprises a first sense electrode having a third polarity and a second sense electrode having a fourth polarity 180 degrees out of phase with the third polarity.

8. The electromechanical resonator of claim 1 further comprising:
a transimpedance amplifier having a differential output and having a differential input coupled to the sense electrode set.

9. The electromechanical resonator of claim 8:
wherein the differential input comprises a negative input and a positive input;
wherein the at least one pair of alternating pole interdigitated sense electrodes comprises a first sense electrode coupled to the negative input and a second sense electrode coupled to the positive input; and
wherein the differential output comprises a positive output and a negative output; and
wherein the transimpedance amplifier further comprises:
a first feedback resistor coupled between the positive output and the negative input; and
a second feedback resistor coupled between the negative output and the positive input; and
wherein an output voltage between the positive output and the negative output is Vod.

10. The electromechanical resonator of claim 9:
wherein the at least one pair of alternating pole interdigitated drive electrodes comprises a first drive electrode coupled to a first AC driving voltage source having a voltage of Vid/2, and a second drive electrode coupled to a second AC driving voltage source having a voltage of −Vid/2; and
wherein an open loop transfer function of the resonator is abs(Vd/Vi).

11. The electromechanical resonator of claim 1:
wherein the resonator comprises a proof mass between the drive electrode set and the sense electrode set;
wherein the first gap is between the drive electrode set and the proof mass; and
wherein the second gap is between the proof mass and the sense electrode set.

12. The electromechanical resonator of claim 1:
wherein each electrode of the pair of alternating pole interdigitated drive electrodes comprises a parallel plate capacitive transducer; and
wherein each electrode of the pair of alternating pole interdigitated sense electrodes comprises a parallel plate capacitive transducer.

13. A phononic crystal acoustic processing device comprising:
a piezoelectric interdigitated drive transducer;
a phononic crystal coupled to the piezoelectric interdigitated drive transducer; and
a piezoelectric interdigitated sense transducer coupled to the phononic crystal on a side of the phononic crystal opposite to the piezoelectric interdigitated drive transducer;

wherein the piezoelectric interdigitated drive transducer comprises:
a piezoelectric layer; and
at least one pair of alternating pole interdigitated drive electrodes on the piezoelectric layer; and
wherein the piezoelectric interdigitated sense transducer comprises:
at least one pair of alternating pole interdigitated sense electrodes on the piezoelectric layer.

14. The phononic crystal acoustic processing device of claim 13:
wherein the at least one pair of alternating pole interdigitated drive electrodes comprises a first drive electrode having a first polarity and a second drive electrode having a second polarity 180 degrees out of phase with the first polarity;
wherein the at least one pair of alternating pole interdigitated sense electrodes comprises a first sense electrode having a third polarity and a second sense electrode having a fourth polarity 180 degrees out of phase with the third polarity; and
wherein feedthrough due to parasitic capacitance from the drive electrode set to the sense electrode set is reduced due to the first and second drive electrodes being driven 180 degrees out of phase with one another.

15. A piezoelectric-on-substrate MEMS resonator comprising:
a piezoelectric layer;
a drive electrode set comprising at least one pair of alternating pole interdigitated drive electrodes on the piezoelectric layer; and
a sense electrode set comprising at least one pair of alternating pole interdigitated sense electrodes on the piezoelectric layer and separated from the drive electrode set by a gap;
wherein the drive electrode set is on a first side of the piezoelectric layer; and
wherein the sense electrode set is on a second side of the piezoelectric layer opposite the first side.

16. The piezoelectric-on-substrate MEMS resonator of claim 15:
wherein the at least one pair of alternating pole interdigitated drive electrodes comprises a first drive electrode having a first polarity and a second drive electrode having a second polarity 180 degrees out of phase with the first polarity;
wherein the at least one pair of alternating pole interdigitated sense electrodes comprises a first sense electrode having a third polarity and a second sense electrode having a fourth polarity 180 degrees out of phase with the third polarity; and wherein feedthrough due to parasitic capacitance from the drive electrode set to the sense electrode set is reduced due to the first and second drive electrodes being driven 180 degrees out of phase with one another.

17. A device for providing alternating pole interdigitated drive electrodes and alternating pole interdigitated sense electrodes comprising:
a first drive pad;
a second drive pad;
a first sense pad;
a second sense pad;
a first drive bus coupled to the first drive pad;
a second drive bus coupled to the second drive pad;
a first sense bus coupled to the first sense pad;
a second sense bus coupled to the second sense pad;
a plurality of first drive electrode fingers coupled to the first drive bus;
a plurality of second drive electrode fingers coupled to the second drive bus;
a plurality of first sense electrode fingers coupled to the first sense bus;
a plurality of second sense electrode fingers coupled to the second sense bus;
wherein the plurality of first drive electrode fingers are interdigitated with the plurality of second drive electrode fingers so that the first drive electrode fingers and the second drive electrode fingers alternate; and
wherein the plurality of first sense electrode fingers are interdigitated with the plurality of second sense electrode fingers so that the first sense electrode fingers and the second sense electrode fingers alternate.

18. The device of claim 17:
wherein the first drive electrode fingers and the second drive electrode fingers extend so that an end of each first drive electrode finger and each second drive electrode finger is arranged along a circumference; and
wherein the first sense electrode fingers and the second sense electrode fingers extend so that an end of each first sense electrode finger and each second sense electrode finger is arranged along the circumference.

19. The device of claim 17:
wherein each first drive electrode finger has a first polarity and each second drive electrode finger has a second polarity 180 degrees out of phase with the first polarity; and
wherein each first sense electrode finger has a third polarity and each second sense electrode finger has a fourth polarity 180 degrees out of phase with the third polarity.

* * * * *